(12) United States Patent
Wu et al.

(10) Patent No.: US 6,733,597 B2
(45) Date of Patent: May 11, 2004

(54) METHOD OF CLEANING A DUAL DAMASCENE STRUCTURE

(75) Inventors: Chih-Ning Wu, Hsinchu (TW); Sun-Chieh Chien, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 105 days.

(21) Appl. No.: 09/841,817

(22) Filed: Apr. 24, 2001

(65) Prior Publication Data
US 2002/0148487 A1 Oct. 17, 2002

(30) Foreign Application Priority Data
Apr. 17, 2001 (TW) ........................................ 90109100 A

(51) Int. Cl.⁷ ................................................. B08B 3/00
(52) U.S. Cl. .............................. 134/26; 134/1.2; 134/2; 134/3; 134/31; 134/902; 216/67; 216/78; 216/81; 216/95; 216/108; 216/109; 438/906
(58) Field of Search ........................... 134/1.2, 2, 3, 31, 134/902, 26, 22; 216/67, 78, 81, 95, 108, 109, 104, 105, 106, 107; 438/906, 745, 690; 257/E23.145, E21.585

(56) References Cited

U.S. PATENT DOCUMENTS

| | | | | | |
|---|---|---|---|---|---|
| 5,320,709 | A | * | 6/1994 | Bowden et al. | 438/745 |
| 5,670,421 | A | * | 9/1997 | Nishitani et al. | 438/641 |
| 5,904,560 | A | * | 5/1999 | Brumley | 438/639 |
| 6,187,682 | B1 | * | 2/2001 | Denning et al. | 438/694 |
| 6,232,237 | B1 | * | 5/2001 | Tamaoka et al. | 438/725 |
| 6,293,848 | B1 | * | 9/2001 | Fang et al. | 451/36 |
| 6,361,712 | B1 | * | 3/2002 | Honda et al. | 252/79.3 |
| 6,440,873 | B1 | * | 8/2002 | Wu et al. | 438/745 |

FOREIGN PATENT DOCUMENTS

EP 0 90111160 A2 * 8/1998

* cited by examiner

Primary Examiner—M. Kornakov
(74) Attorney, Agent, or Firm—Charles C. H. Wu; Wu & Cheng, LLP

(57) ABSTRACT

A method is provided for cleaning a dual damascene structure. A first metal layer, a cap layer, and a dielectric layer are formed on a substrate in sequence. Then a dual damascene opening is formed in the dielectric layer and the cap layer exposing the first metal layer. Next, a post-etching cleaning step is carried out to clean the dual damascene opening using a fluorine-based solvent. Then, an argon gas plasma is sputtered to clean the dual damascene opening before a second metal layer fills in the dual damascene opening.

6 Claims, 2 Drawing Sheets

METHOD OF CLEANING A DUAL DAMASCENE STRUCTURE

CROSS-REFERENCE TO RELATED APPLICATION

This application claims the priority benefit of Taiwan application serial no. 90109100, filed on Apr. 17, 2001.

BACKGROUND OF THE INVENTION

1. Field of Invention

The present invention relates to a cleaning method of a semiconductor structure. More particularly, the present invention relates to a cleaning method of a dual damascene structure.

2. Description of Related Art

When using a dual damascene structure in multilevel metal interconnects, the reliability and process ability of the device are increased. A copper conducting wire is generally used in this process to decrease the resistance of the conducting wire and increase the speed and quality of the integrated circuit device. After the device achieves high integration, using a dielectric layer having a low dielectric constant (low-k) to manufacture the dual damascene structure has gradually become the major technique in the semiconductor industry.

FIG. 1 illustrates a cross-sectional view of a conventional dual damascene structure.

Referring to FIG. 1, a metal layer 102, a cap layer 104 and a dielectric layer 106 are formed on a substrate 100. A dual damascene opening 108 is formed by etching the dielectric layer 106 and cap layer 104. The metal layer 102 serves as an etching stop layer, and a part of the surface of the metal layer 102 is exposed. The material of the cap layer 104 is silicon nitride. This etching process produces a lot of polymer residue that remains on the profile of dual damascene opening 108 and the surface of the metal layer 102. Therefore, a cleaning step can remove the polymer residue and metal oxide on the profile of the dual damascene opening 108 and the surface of the metal layer 102 before a second metal layer fills in the dual damascene opening 108. In the final step, the second metal layer fills in the dual damascene opening 108.

In the conventional cleaning method of the dual damascene opening, an amine-based organic solvent first cleans the dual damascene opening 108, followed by an argon sputtering step to bombard the metal oxide for removing the polymer residue before the second metal layer fills in the dual damascene opening 108. However, the conventional method cannot completely remove the metal oxide from the surface of the metal layer 102. In another conventional cleaning method of dual damascene opening, an amine-based organic solvent cleans as the opening similar to the previous description, and then hydrogen gas ($H_2$) is used to deoxidize the metal oxide for cleaning and removing the polymer residue and the metal oxide. The second cleaning method can completely remove the polymer residues and metal oxide, but the hydrogen also reacts on the dielectric layer 106, and a bow shaped recess 110 is formed, which damages the profile of the dual damascene 108.

SUMMARY OF THE INVENTION

The invention provides a cleaning method of a dual damascene to remove the polymer residue and the metal oxide.

The invention also provides a cleaning method of a dual damascene to reduce the via resistance and prevent erosion of the metal layer.

The invention also provides a cleaning method of a dual damascene to prevent further damage on the profile of the dual damascene.

As embodied and broadly described herein, the invention provides a cleaning method of a dual damascene. A first metal layer, a cap layer and a dielectric layer are formed in sequence on a substrate, and then a dual damascene opening is formed in the dielectric layer and the cap layer to expose the surface of the first metal layer. There are two types of cleaning steps after etching. The first method uses a fluorine based organic solvent to clean the dual damascene opening. An alternative cleaning method for the dual damascene opening first uses a hydrogen peroxide based solvent at a high temperature, followed by a hydrofluoric acid solvent cleaning step. Then, an argon gas plasma is sputtered to clean the dual damascene opening before a second metal layer fills in the dual damascene opening.

The cleaning method of this invention is more efficient to remove the polymer residue on the dielectric layer and the metal oxide on the metal layer, and reduces the via resistance in the dual damascene.

The cleaning method of this invention also can prevent further damage on the profile of the dual damascene opening.

The cleaning method of this invention also can prevent the erosion of the metal layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
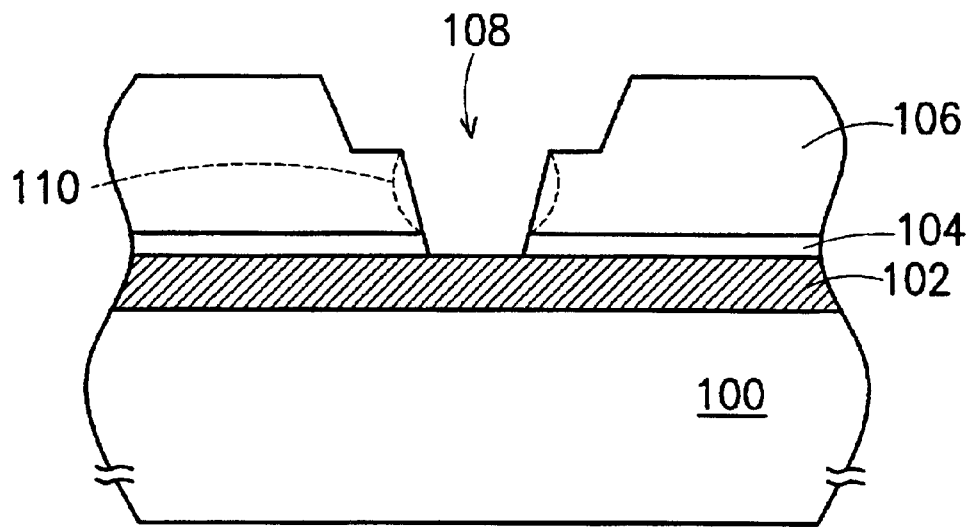
FIG. 1 illustrates a cross-sectional view of a conventional cleaning method of a dual damascene structure.
Figure 2:
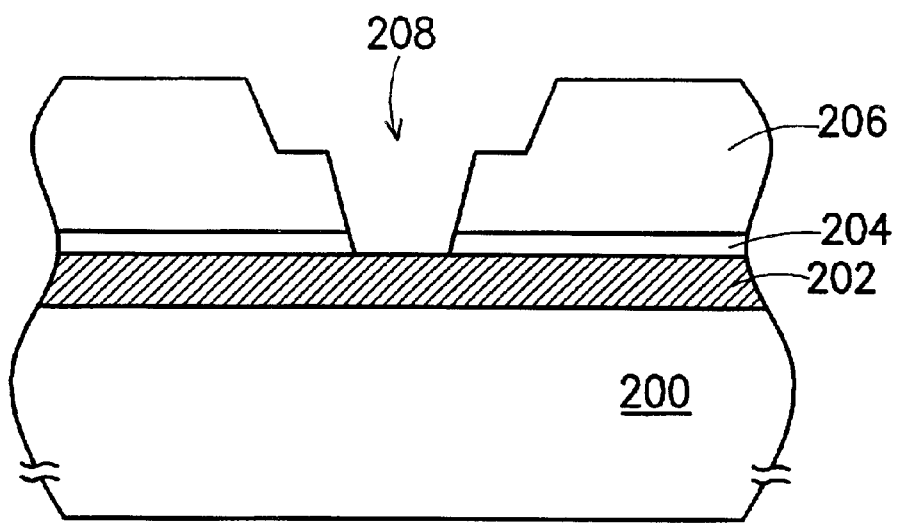
FIG. 2 illustrates a cross-sectional view of a cleaning method of a dual damascene structure according to one preferred embodiment of this invention.

FIG. 2 illustrates a cross-sectional view of a cleaning process of a dual damascene according to one preferred embodiment of this invention.

Referring to FIG. 2, a first metal layer 202, a cap layer 204 and a dielectric layer 208 are formed in sequence on a substrate 200. The material of the first metal layer 202 is copper. The material of the cap layer 204 is silicon nitride. And the material of the dielectric layer 206 is silicate and fluorine carbide, and both materials have a low dielectric constant (low-k). Next, a dual damascene opening 208 is formed in the dielectric layer 208 and the cap layer 204 by dry etching.

The polymer residue and the metal oxide residue are produced in the profile of the dual damascene opening 208 and the surface of the metal layer 202 after the etching process. Therefore, a cleaning step is carried out to remove the polymer residue and metal oxide on the surface of the metal layer 202 in the dual damascene opening 208.

Figure 3:
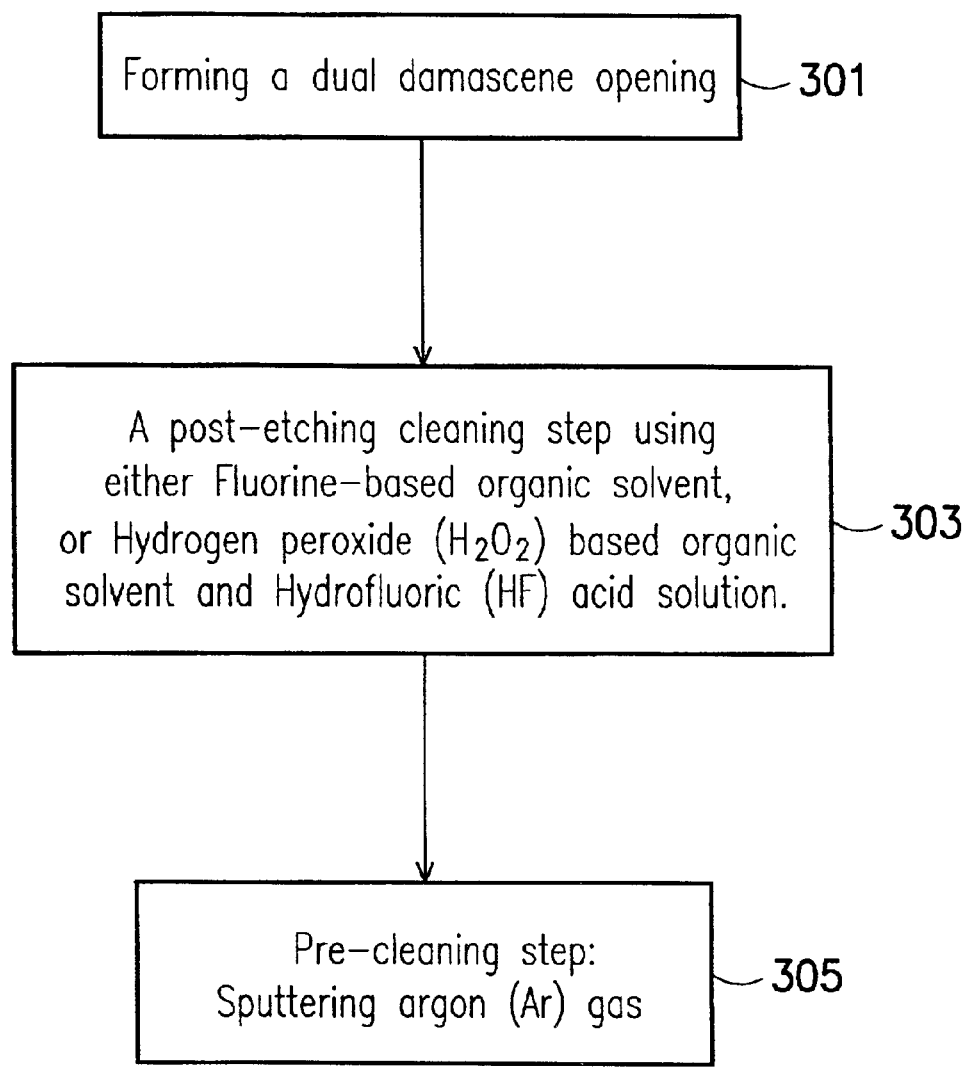
FIG. 3 illustrates a flow diagram showing the cleaning steps of a dual damascene structure according to one preferred embodiment of this invention.

FIG. 3 illustrates a flow diagram showing the cleaning steps of a dual damascene structure according to one preferred embodiment of this invention.

Referring to FIG. 3, step 301 shows that the dual damascene opening 208 is formed in the dielectric layer 206 and the cap layer 204. Step 303 shows the post-etching cleaning step and two types of cleaning methods for the post-etching cleaning.

The first post-etching cleaning method uses a fluorine-based organic solvent to clean the dual damascene opening 208. The fluorine-based organic solvent includes an oxidizing agent and a chelating agent in a fluoride acetate solvent, or it includes the oxidizing agent and the chelating agent in an ammonium fluoride solvent. The fluoride acetate and the ammonium fluoride both can prevent over erosion on the metal layer. The oxidizing agent can oxidize the polymer residue, and the chelating agent can prevent over oxidation on the metal layer.

The other method of post-etching cleaning uses a hydrogen peroxide (H2O2) solvent to clean the dual damascene opening 208, which takes about 5 to 10 minutes. Then a dilute hydrofluoric (HF) acid solvent is used to clean the dual damascene opening 208, which takes about 2 to 10 minutes. More particularly, the $H_2O_2$ solvent is mixed with hydrogen peroxide and water at a ratio of between 1:20 and 1:80. The HF acid solvent is mixed with hydrofluoric acid and water at a ratio of 1:600. The hydrogen peroxide is the oxidizing agent to remove the polymer residue, and the hydrofluoric acid can remove the oxide residue on the metal layer 202. The best temperature of the hydrogen peroxide solvent is between 40 and 60 degrees Celsius to prevent over oxidation on the metal layer 202.

Step 305 shows the pre-cleaning step. An argon (Ar) gas plasma is sputtered to remove the metal oxide on the profile of the dual damascene opening 208 and the metal layer 202. More particularly, the sputtering power is between 75 and 300 watts to sputter the argon gas and takes about 10 to 30 seconds.

A fluorine-based organic solvent or a hydrogen peroxide based solvent with a hydrofluoric acid solvent are used to carry out the post-etching cleaning step 303. Then argon gas is sputtered to carry out the pre-cleaning step 305. Those steps can completely remove the polymer residue and the metal oxide, do not damage the profile of the dual damascene opening 208, and prevent the erosion of the metal layer 202.

After the cleaning steps are completed, the dual damascene opening 208 is filled with a second metal layer to complete the dual damascene structure process. The material of the second metal layer includes, for example, copper. The method of forming the dual damascene structure is described in the following steps. First, barrier layers may be formed conformal to a profile of the dual damascene opening 208. A seeding step is performed around the dual damascene opening 208. The opening is filled with the second metal layer formed by physical vapor deposition (PVD), and the second metal layer is then polished by chemical mechanical polishing to remove the extra portion of the second metal layer until the dielectric layer 206 is exposed.

In the above description, there are three advantages of this invention:

1. The cleaning process of this invention is efficient and removes polymer residue and the metal oxide, and reduces the via resistance after forming the structure of the dual damascene.
2. The cleaning process of this invention can keep the integrity of the profile of the dual damascene opening.
3. The cleaning process of this invention can prevent erosion on the metal layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of cleaning a dual damascene structure, comprising:

providing a substrate, wherein a first metal layer, a cap layer, and a dielectric layer are formed in sequence on the substrate;

forming a dual damascene opening in the dielectric layer and the cap layer to expose the first metal layer;

performing a post-etching cleaning step to clean the dual damascene opening using a fluorine-based organic solvent wherein the fluorine-based organic solvent includes an organic solvent with fluoride acetate acid as a principal solvent; and sputtering an argon gas to clean the dual damascene opening before forming a second metal layer in the dual damascene opening.

2. The method of claim 1, wherein the fluorine-based organic solvent has a chelating agent and an oxidizing agent.

3. The method of claim 1, wherein a sputtering power is between 75 and 300 watts to sputter the argon gas in the dual damascene opening.

4. The method of claim 1, wherein a sputtering time is about 10 to 30 seconds to sputter the argon gas in the dual damascene opening.

5. The method of claim 1, wherein the material of the cap layer is silicon nitride (SiN).

6. The method of claim 1, wherein the material of dielectric layer has a low dielectric constant (low-k), and is silicate based or an organic material.

* * * * *